United States Patent
Logothetidis et al.

(10) Patent No.: US 10,953,558 B2
(45) Date of Patent: *Mar. 23, 2021

(54) RAZOR BLADE COATING

(71) Applicant: BIC-VIOLEX SA, Attiki (GR)

(72) Inventors: Stergios Logothetidis, Salonika (GR); Nikolaos Kalfagiannis, Salonika (GR); Konstantinos Mavroeidis, Athens (GR); Vasileios Papachristos, Athenes (GR); Michail Karousis, Athenes (GR)

(73) Assignee: BIC-VIOLEX SA, Anixi (GR)

( * ) Notice: Subject to any disclaimer, the term of this patent is extended or adjusted under 35 U.S.C. 154(b) by 0 days.

This patent is subject to a terminal disclaimer.

(21) Appl. No.: 16/565,664

(22) Filed: Sep. 10, 2019

(65) Prior Publication Data

US 2020/0023533 A1 Jan. 23, 2020

Related U.S. Application Data

(63) Continuation of application No. 15/500,698, filed as application No. PCT/EP2015/067477 on Jul. 30, 2015, now Pat. No. 10,442,098.

(30) Foreign Application Priority Data

Jul. 31, 2014 (WO) .................. PCT/EP2014/066511

(51) Int. Cl.
*B26B 21/60* (2006.01)
*C23C 14/06* (2006.01)
*B26B 21/40* (2006.01)

(52) U.S. Cl.
CPC .......... *B26B 21/60* (2013.01); *B26B 21/4031* (2013.01); *B26B 21/4068* (2013.01); *C23C 14/067* (2013.01)

(58) Field of Classification Search
CPC . B26B 21/60; B26B 21/4031; B26B 21/4068; C23C 14/067
See application file for complete search history.

(56) References Cited

U.S. PATENT DOCUMENTS

| 4,933,058 A | 6/1990 | Bache et al. |
| 5,232,568 A | 8/1993 | Patent et al. |

(Continued)

FOREIGN PATENT DOCUMENTS

| EP | 1 287 953 | 3/2003 |
| GB | 2 130 955 | 6/1984 |

(Continued)

OTHER PUBLICATIONS

International Search Report of PCT/EP2015/067477 dated Oct. 8, 2015.

(Continued)

*Primary Examiner* — Omar Flores Sanchez
(74) *Attorney, Agent, or Firm* — Polsinelli PC

(57) ABSTRACT

A razor blade substrate having a substrate that includes a blade edge portion having a profiled geometry which is covered by a strengthening coating deposited on the razor blade substrate at least at the blade edge portion. The strengthening coating covering the blade edge tip, having a profiled geometry and having a tapering geometry with two coating sides converge toward a blade edge tip. The strengthening coating includes a strengthening layer made of a titanium- and boron-containing material.

20 Claims, 6 Drawing Sheets

(56) References Cited

U.S. PATENT DOCUMENTS

| | | |
|---|---|---|
| 5,497,550 A | 3/1996 | Trotta et al. |
| 5,669,144 A | 9/1997 | Hahn et al. |
| 6,617,057 B2 | 9/2003 | Gorokhovsky et al. |
| 6,939,445 B2* | 9/2005 | Berger .................. C23C 14/067 |
| | | 204/192.12 |
| 7,510,760 B2 | 3/2009 | Malshe et al. |
| 8,491,989 B2* | 7/2013 | Lechthaler .......... C23C 14/0647 |
| | | 428/216 |
| 9,574,262 B2* | 2/2017 | Henn .................... C03C 17/225 |
| 10,442,098 B2* | 10/2019 | Logothetidis ........... B26B 21/60 |
| 2003/0039867 A1* | 2/2003 | Berger .................. C23C 30/005 |
| | | 428/704 |
| 2004/0214033 A1* | 10/2004 | Berger .................. C23C 14/345 |
| | | 428/689 |
| 2006/0199013 A1 | 9/2006 | Malshe et al. |
| 2017/0136641 A1 | 5/2017 | Siozios et al. |
| 2018/0215056 A1 | 8/2018 | Logothetidis et al. |

FOREIGN PATENT DOCUMENTS

| | | |
|---|---|---|
| GB | 1 465 697 | 2/1997 |
| WO | 03/006218 A1 | 1/2003 |
| WO | 2006/027016 A1 | 3/2006 |
| WO | 2007136777 A2 | 11/2007 |

OTHER PUBLICATIONS

R.A. Andrievskii and G.V. Kalinnikov; Structure and Physicomechanical Properties of Nanocrystalline Boride—Nitride Films; Phys. Solid State 39 (10), Oct. 1997.

Paul H. Mayrhofer, et al.; Microstructural Design of Hard Coatings; P.H. Mayrhofer et al., Progress in Materials Science 51 (2006) 1032-1114.

* cited by examiner ically, during experimentation in view of depositing a titanium- and boron-containing coating on a razor blade edge, the inventors have encountered a coating having excellent properties for a razor blade coating.
RAZOR BLADE COATING This application is a continuation application of U.S. application Ser. No. 15/500,698, filed Jan. 31, 2017, now U.S. Pat. No. 10,442,098, which is a national stage application of International Application No. PCT/EP2015/067477, filed Jul. 30, 2015, which claims priority to PCT/EP2014/066511 filed on Jul. 31, 2014, where the entire contents of both applications are incorporated herein by reference.

FIELD OF INVENTION

The embodiments of the present invention relate to a razor blade.

BACKGROUND OF INVENTION

In particular, the present invention relates to a razor blade having a razor blade edge.

From the prior art, razor blades have been provided. Suitably placed in a razor cartridge, they offer the ultimate function of cutting the hair.

In the past, razor blades have been provided with a substrate and a strengthening coating covering the substrate at the blade edge. The strengthening coating is generally a metal- and/or carbon-containing material, and provides enhanced strength to the razor blade edge, which in turn enhances its life expectancy.

Sometimes, the strengthening coating is further coated by a lubricating coating such as a PTFE coating.

Providing a better coating on a razor blade edge is a challenge. First of all, because the razor blade substrate edge has a very peculiar geometry, depositing a coating on it which would operate as a suitable coating by enhancing the cutting properties and strengthening the razor blade edge is very difficult.

Secondly, since razor blades are a mass consumption goods, the coating would have to be applied on a very uniform way from product to product, and at a high throughput (millions of parts per day), which requires a coating compatible with a very reliable process.

Thirdly, even if it were possible to deposit a new coating on a razor blade, measuring the improvement with respect to prior art products is also very difficult. This is because the perceived quality of shaving by test panels can be very subjective.

Hence, development of a new razor blade coating takes years of R&D work.

Nonetheless, one is still looking to improve razor blades by providing a better razor blade coating.

WO 2006/027,016 describes a razor blade coating including chromium and carbon.

Other prior art documents give endless lists of materials said to be suitable for razor blade coatings. An example of such a document is EP 1 287 953. In view of the provided long list of materials, it is likely that not all of them have been actually tried as razor blade coating components, and it is also likely that some of them would be unsuitable as razor blade coating components.

One aim, when developing a new razor blade coating, is to increase the hardness of the coating material. There are many materials harder than a mixture of chromium and carbon. One possible candidate when looking for a harder material than a mixture of chromium and carbon is titanium diboride.

It should be mentioned that there are other coated cutting tools than razor blades. These cutting tools have their own issues and structures designed to face these issues. For example, WO 2007/136,777 aims at obtaining a stable cutting edge consisting of a multilayer coating with different architectures on both sides of the blade of a rotary tool. Regarding the coating itself, it includes a specific top wear-resistant low friction anti-galling segment overlaying a bottom multilayer bondcoating cermet segment which accommodates the internal stresses in the top segment and secures the highest toughness of the entire coating system. This is a specific coating in view of specific cutting applications, where "razor blades" are mentioned as a surgical or dental instrument.

Turning back to shaver razor blades, unexpectedly, during experimentation in view of depositing a titanium- and boron-containing coating on a razor blade edge, the inventors have encountered a coating having excellent properties for a razor blade coating.

SUMMARY OF THE INVENTION

The embodiments of the invention relate to a razor blade including a blade edge portion, the razor blade including:

a razor blade substrate having a substrate edge portion in the blade edge portion of the razor blade, the substrate edge portion having a profiled geometry and having a tapering geometry with two substrate sides converging toward a substrate tip, a strengthening coating deposited on the razor blade substrate at least at the blade edge portion, the strengthening coating covering the substrate tip, the strengthening coating having a profiled geometry and having a tapering geometry with two coating sides converging toward a coating tip, Wherein the strengthening coating includes a strengthening nanocrystalline layer made of a mixture of titanium and boron including at least one of titanium-rich areas and boron-rich areas, where "rich" is used by reference to a stoichiometric $TiB_2$ composition.

The above razor blade has a significantly enhanced hardness, and manufacturability enabling it to meet the other requirements for a razor blade coating: reliably uniform features at high industrial manufacture throughput (at reasonable cost).

A "titanium-rich" area refers to an area where the proportion of titanium is higher than in titanium diboride.

A "boron-rich" area refers to an area where the proportion of boron is higher than in titanium diboride.

In some embodiments, one might also use one or more of the following features:

the average proportion of boron and titanium atoms in the strengthening layer is between 1.3:1 and 2.3:1;

a razor blade, wherein the average proportion of boron and titanium atoms in the strengthening layer is between 2.01:1 and 2.3:1;

the average proportion of boron and titanium atoms in the strengthening layer is between 1.3:1 and 1.99:1;

the nanocrystalline layer includes titanium diboride areas;

a razor blade, wherein the areas of titanium diboride are non-columnar;

a razor blade wherein the strengthening nanocrystalline layer includes nanocrystalline arrangements, wherein the atoms of the nanocrystals are arranged in a hexagonal lattice configuration;

a razor blade wherein the strengthening layer includes featureless crystallites having a characteristic dimension between 2 and 15 nanometres (nm);

a razor blade, wherein the strengthening layer is deposited under conditions which, when applied to deposition on a flat witness sample, provide a coating with a density which is above 3.9 grams per cubic centimetre (g/cm$^3$);

a razor blade, wherein a combined thickness of the blade substrate and strengthening coating, measured between the two coating sides orthogonal to a line bisecting the blade edge portion, at a distance of 5 micrometers from the coating tip, is between 1.8 and 2.5 micrometers, and preferably between 1.9 and 2.4 micrometers;

a razor blade, wherein a combined thickness of the blade substrate and strengthening coating, measured between the two coating sides orthogonal to a line bisecting the blade edge portion, at a distance of 20 micrometers from the coating tip, is between 5.1 and 7.3 micrometers, and preferably between 5.4 and 7.1 micrometers;

a razor blade, wherein the razor blade substrate is made of stainless steel;

a razor blade, wherein the strengthening coating includes an interlayer between the razor blade substrate and the strengthening layer;

a razor blade, wherein the interlayer includes titanium;

a razor blade, wherein the interlayer is made of Titanium;

a razor blade, wherein the strengthening coating includes a metal-containing overcoat layer over the strengthening layer;

a razor blade, wherein the overcoat layer includes Chromium;

a razor blade, wherein the strengthening layer is the sole layer of the strengthening coating;

a razor blade, wherein the thickness of the strengthening layer, measured normal to the substrate side, is between 20 and 400 nanometres (nm), for example between 20 and 150 nm or between 40 and 250 nm;

a razor blade, further including a polymer coating over the strengthening coating;

Aa razor blade, wherein the strengthening layer disorderly includes areas having different proportions of titanium and boron atoms; and wherein, in at least one area, the proportion of boron and titanium is comprised between y:1 and z:1, wherein y and z are comprised between 1.3 and 1.99, and y is lower than z, and/or wherein, in at least one area, the proportion of boron and titanium is comprised between u:1 and v:1, wherein u and v are comprised between 2.01 and 2.3 and u is lower than v.

According to another aspect, the present invention relates to a razor head including a cartridge and a razor blade, the razor blade being mounted in the cartridge.

According to another aspect, the present invention relates to a razor including a handle and a razor head wherein the razor head is being attached to the handle.

In some specific embodiments, the coating is not a pure titanium diboride coating. It includes titanium and boron. One or more areas are boron-rich areas and/or one or more areas are titanium-rich areas. Yet, the dispersion of the titanium concentration within the layer can be controlled in order not to exceed upper or lower thresholds, which would lead to loss of properties.

According to another aspect, the razor blade includes:

a razor blade substrate having a substrate edge portion in the blade edge portion of the razor blade, the substrate edge portion having a profiled geometry and having a tapering geometry with two substrate sides converging toward a substrate tip, a strengthening coating deposited on the razor blade substrate at least at the blade edge portion, the strengthening coating covering the substrate tip, the strengthening coating having a profiled geometry and having a tapering geometry with two coating sides converging toward a coating tip, wherein the strengthening coating includes a mixture of titanium and boron, wherein the strengthening layer is deposited under conditions which, when applied to deposition on a flat witness sample, provide a coating the density of which is above 3.9 grams per cubic centimetre (g/cm$^3$).

According to another aspect, the razor blade includes:

a razor blade substrate having a substrate edge portion in the blade edge portion of the razor blade, the substrate edge portion having a profiled geometry and having a tapering geometry with two substrate sides converging toward a substrate tip, a strengthening coating deposited on the razor blade substrate at least at the blade edge portion, the strengthening coating covering the substrate tip, the strengthening coating having a profiled geometry and having a tapering geometry with two coating sides converging toward a coating tip, wherein the strengthening coating includes a mixture of titanium and boron, wherein a combined thickness of the blade substrate and strengthening coating, measured between the two coating sides orthogonal to a line bisecting the blade edge portion, at a distance of 5 micrometers from the coating tip, is between 1.8 and 2.5 micrometers, and preferably between 1.9 and 2.4 micrometers.

According to another aspect, a combined thickness of the blade substrate and strengthening coating, measured between the two coating sides orthogonal to a line bisecting the blade edge portion, at a distance of 20 micrometers from the coating tip, is between 5.1 and 7.3 micrometers, and preferably between 5.4 and 7.1 micrometers.

According to another aspect, the razor blade includes:

a razor blade substrate having a substrate edge portion in the blade edge portion of the razor blade, the substrate edge portion having a profiled geometry and having a tapering geometry with two substrate sides converging toward a substrate tip, a strengthening coating deposited on the razor blade substrate at least at the blade edge portion, the strengthening coating covering the substrate tip, the strengthening coating having a profiled geometry and having a tapering geometry with two coating sides converging toward a coating tip, wherein the strengthening coating includes a mixture of titanium and boron, wherein a combined thickness of the blade substrate and strengthening coating, measured between the two coating sides orthogonal to a line bisecting the blade edge portion, at a distance of 20 micrometers from the coating tip, is between 5.1 and 7.3 micrometers, and preferably between 5.4 and 7.1 micrometers.

According to another aspect, a combined thickness of the blade substrate and strengthening coating, measured between the two coating sides orthogonal to a line bisecting the blade edge portion, at a distance of 5 micrometers from the coating tip, is between 1.8 and 2.5 micrometers, and preferably between 1.9 and 2.4 micrometers.

BRIEF DESCRIPTION OF THE DRAWINGS

Other characteristics and advantages of the present invention will readily appear from the following description of some of its embodiments, provided as non-limitative examples, and of the accompanying drawings.

On the drawings.

On the different Figures, the same reference signs designate like or similar elements.

DETAILED DESCRIPTION

Figure 1:
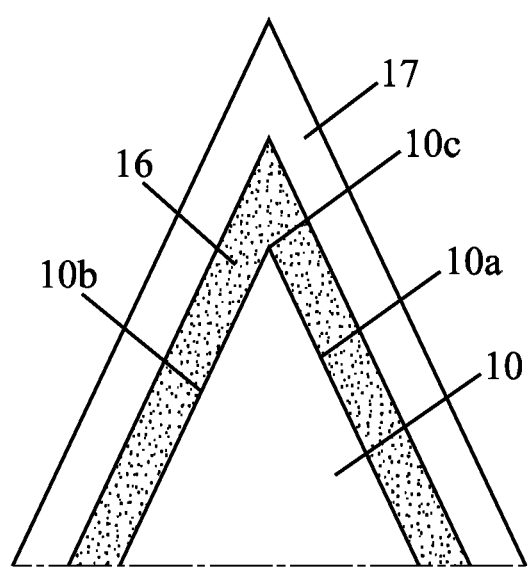
FIG. 1 is a schematic drawing of a blade profile in sectional view.

Hereinafter, the present invention is described in detail with reference to the accompanying drawings. Generally the razor blades comprise a blade substrate, which further includes a blade body and a blade edge. FIG. 1 shows a razor blade edge substrate 10 that includes tapered sides 10a, 10b which meet in a blade tip 10c. The shape of the blade edge substrate 10 can be angular or arched or the combination of these two. However, the special geometry and the material of the blade edge substrate 10 usually do not provide sufficient hardness for shaving purposes and coating layers are implemented on the blade edge substrate to improve the hardness of the blade edge and thereby enhance the quality of the shaving. The coating layers enable to reduce the wear of the blade edge, improve the overall cutting properties and prolong the usability of the razor blade.

On FIG. 1, the blade edge substrate 10 is coated with a strengthening coating layer 16 and a lubricating layer 17. The lubricating layer, which may comprise fluoropolymer, is commonly used in the field of razor blades for reducing friction during shaving. The strengthening coating layer 16 is used for its mechanical properties. The strengthening coating layer 16 includes titanium and boron. More precisely, the strengthening coating layer 16 is made of titanium and boron with a low content of impurities. The content of impurities is kept as low as economically viably possible. The strengthening coating layer 16 can be prepared with various proportions of titanium and boron within the layer. This means that there could be a mixture of titanium diboride (TiB$_2$) and/or other components including titanium and/or boron. The coating layer 16 includes Ti-rich and/or B-rich areas. "rich" is used in relation to the normal stoichiometric respective concentrations of Ti and B compared to TiB$_2$. The material which constitutes the layer 16 can be indicated as TiB$_x$. For example, the coating layer 16 has local variations of concentrations of these elements, having B-rich areas, where the atom ratio B:Ti is over 2, up to 2.3 (x included between 2.01 and 2.3), and Ti rich areas, where the ratio B:Ti is below 2, down to 1.3 (x included between 1.3 and 1.99). The local variations can be randomly arranged in the layer. These proportions of titanium, boron and titanium diboride can provide additional improvements for the overall coating of the blade edge substrate 10. So, in the present application, when it is referred to TiB$_x$, it is referred to a coating as described above.

Figure 2:
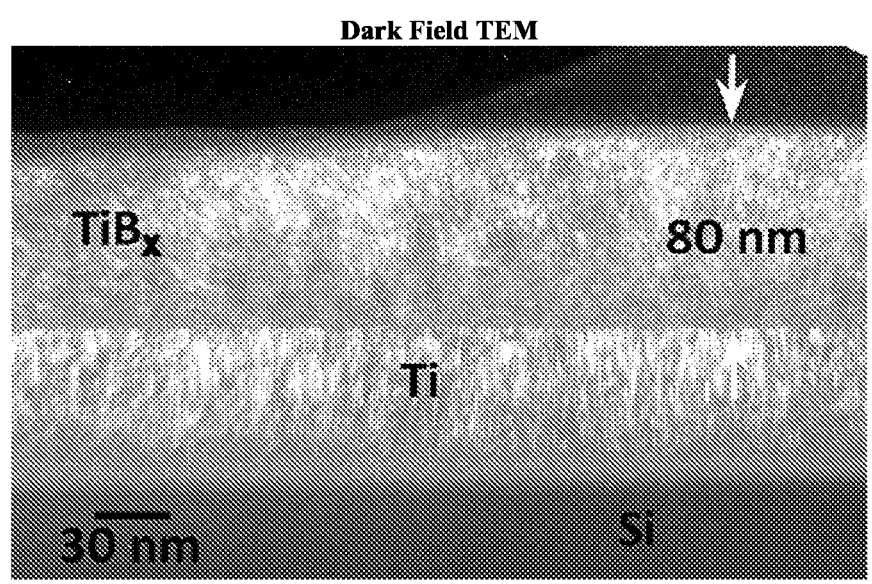
FIG. 2 is a dark field transmission electronic microscope view of a coated sample.

Referring to FIG. 2, a coating layer configuration is shown, wherein a substrate S is covered by an interlayer 15 made of titanium which is covered by a strengthening layer 16 made of TiB$_x$. This layer configuration corresponds to a coating layer configuration on a razor blade edge.

Figure 9:
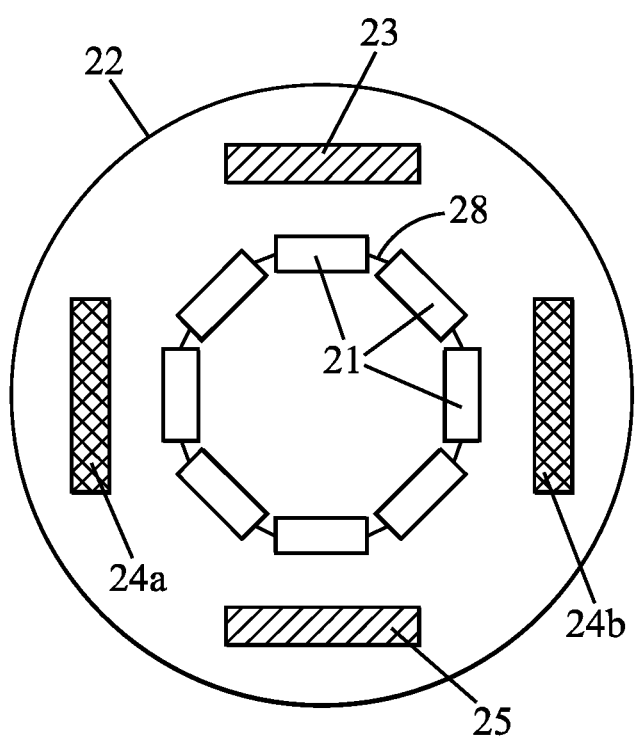
FIG. 9 is a schematic top view of a deposition apparatus useful for the manufacturing of the blades.
Figure 10:
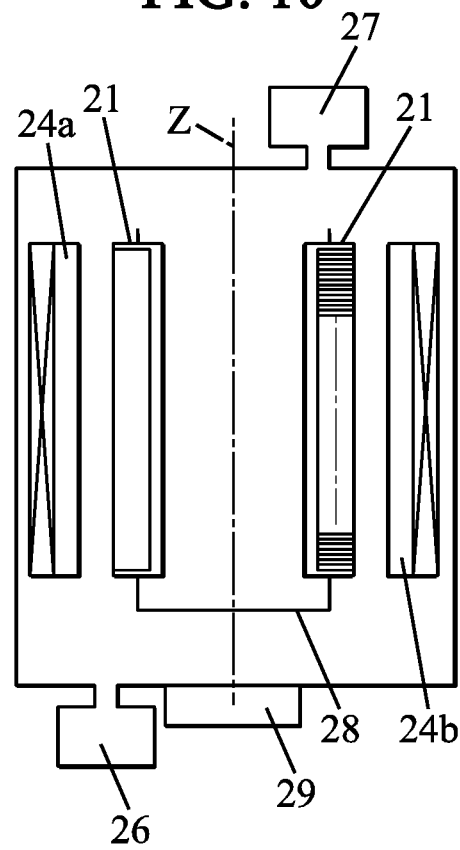
FIG. 10 is a schematic side view of the apparatus of FIG. 9.

The manufacturing of the coated blades can be made by sputter deposition from Ti and TiB$_2$ targets. As visible from FIGS. 9 and 10, the blade substrates S are loaded on bayonets 21 in the depositing chamber 22, which includes a Ti target 23, and two TiB$_2$ targets 24a, 24b. In some embodiments, the depositing chamber may also comprise a Cr target 25. For example, the four targets are provided as four corners of a square (seen from the top). For example, the two TiB$_2$ targets are facing each other. Before the deposition, a sputter etching step can be carried out. The depositing chamber 22 is evacuated up to a base pressure of $10^{-5}$ Torr using vacuum means 26. Then Ar gas is inserted from an Ar gas source 27 into the chamber 22 up to a pressure of 8 mTorr ($8 \cdot 10^{-3}$ Torr). By rotating the loaded bayonets connected together through a common structure 28 at a constant speed of 6 rpm using a motor 29, all targets, and notably the Ti and TiB$_2$ targets are operated under DC current control at 0.2 Amps. A DC voltage of 200-600 V is applied on the stainless steel blades for 4 minutes. During the sputter etching step, impurities are removed from the blade substrates and the targets through bombardment of Argon ions.

For depositing the titanium interlayer 15, after the end of sputter etching step, the chamber pressure is adjusted to 3 mTorr. The Ti and TiB$_2$ target(s) are operated under DC current control at 3 and 0.2 Amps respectively while a DC voltage of 0-100 V is applied on the rotating blades. The current on the TiB$_2$ targets (and the same on the Cr target if present) is used to prevent elements from depositing on these targets. Adjusting the deposition time, a Ti layer of 10-100 nm, for example of 10-50 nm is deposited on the edge of the blade samples.

For depositing the TiB$_x$ strengthening layer 16, after the deposition of the Ti interlayer 15, the Cr, Ti and TiB$_2$ targets operate simultaneously, with the current on the Cr target set to 0.2 Amps, that on the Ti target(s) adjusted and the current on TiB$_2$ target(s) set to 3 Amps. The current on the Cr target is used to prevent elements from depositing on that target. Further, the ratio of currents applied on the Ti and TiB2 targets is adjusted as a function of the desired composition of the coating. A DC bias voltage of 0 to 600 V is applied on the rotating blades. Adjusting the deposition time, a TiB$_x$ layer of 20-150 nm is deposited on the Ti layer. Alternately, a TiB$_x$ layer of 40-250 nm is deposited on the Ti layer. In general, a TiB$_x$ layer of 20-400 nm can be deposited on the Ti layer.

Figure 6:
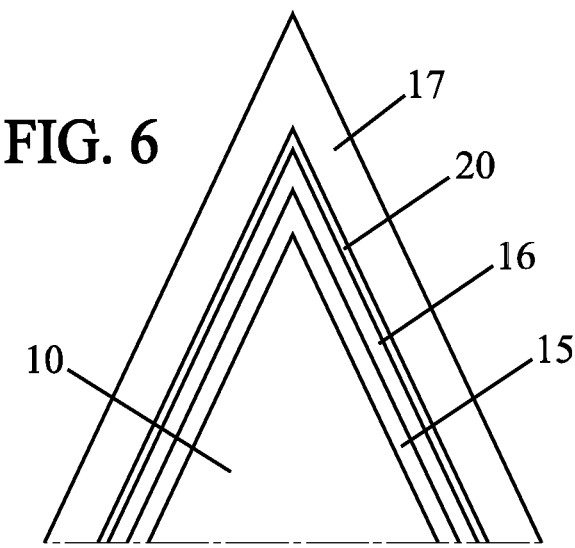
FIG. 6 is a schematic drawing of a coated blade edge profile in sectional view.

As more detailed in the following description a metal-containing overcoat layer 20 can be provided over the strengthening layer 16. For instance, on top of the TiB$_x$ strengthening layer 16, a thin 10-50 nm Cr layer 20 can be deposited, this layer configuration is depicted on FIG. 6. For this step, the coated blades can be moved to another sputter machine, or it can be carried out in the same machine, including a Cr target, as shown on FIGS. 9 and 10. The current on the Cr target(s) is set at 3 Amps and a bias voltage of 0-450 V is applied on the blades. If it is conducted in the same sputter machine, one may provide for protecting the non-operating target(s) from contamination from the operating target(s), and for preventing operation of non-operating targets at each step.

Referring to FIG. 2, the aforesaid coating layer configuration is shown wherein the substrate S is covered by a Ti interlayer 15. Further, the Ti interlayer 15 is covered by a TiB$_x$ strengthening layer 16. Moreover, layers 15 and 16 exhibit a nanocrystalline arrangement. In the TiB$_x$ layer, the atoms of the nanocrystals are arranged in a hexagonal lattice configuration. A layer exhibiting a nanocrystalline arrangement is also called a nanocrystalline layer. The nanocrystals can be defined as crystal structures having at least one, and notably all 3 main dimensions lower than 100 nanometres (nm). The Ti nanocrystals form thin columns along the growth direction. The columns have diameters up to 10-12 nm.

The Ti layer 15 is covered by a TiB$_x$ strengthening layer 16 including TiB$_2$ nanocrystalline areas wherein the atoms of the nanocrystals are arranged in a hexagonal lattice configuration. The TiB$_x$ structure does not comprise any columnar structure, as visible on FIG. 2. Such a featureless structure has interesting properties for a razor blade strengthening coating.

The layer structure on substrate S, shown on FIG. 2, corresponds to a layer structure on a blade edge substrate 10. The growth conditions and the applied bias voltage during formation of the TiB$_x$ strengthening layer 16 provide a hard structure with preferable mechanical properties for shaving, particularly compared to a TiB$_2$ columnar structure. The preferred growth conditions and the applied bias voltage on the substrate enable to grow the TiB$_x$ strengthening layer 16 including TiB$_2$ nanocrystalline areas wherein the atoms of the nanocrystals are arranged in a hexagonal lattice configuration.

Figure 3:
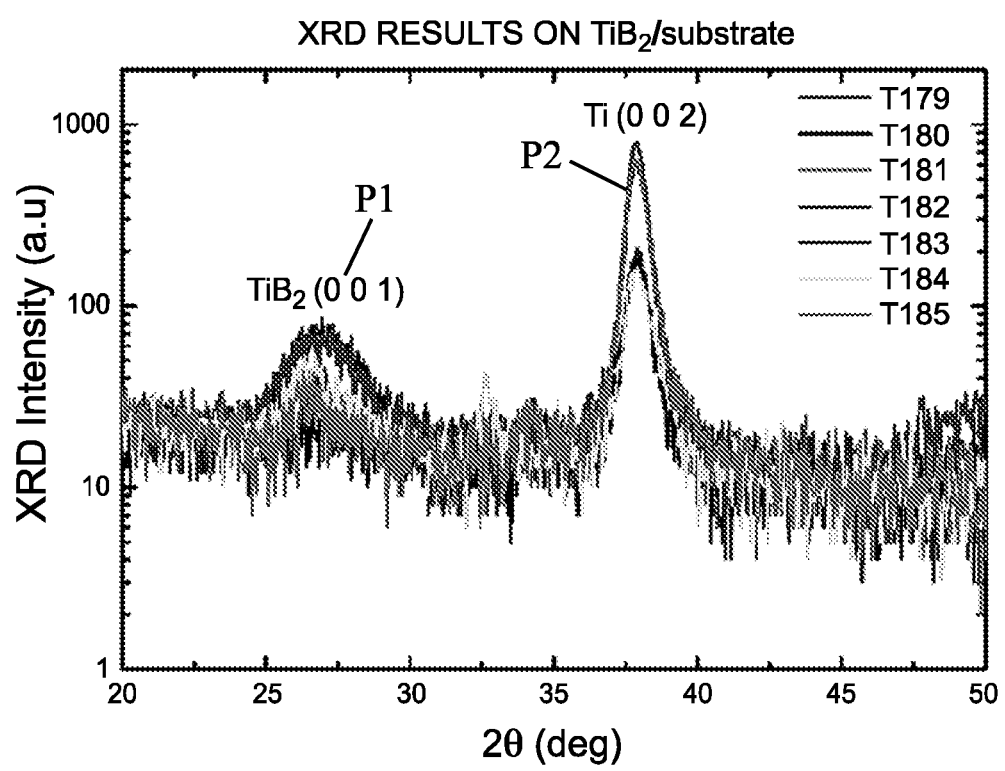
FIG. 3 shows X-ray diffraction spectrums of the Ti and TiB$_x$ layers deposited under various conditions on a substrate.

On FIG. 3, an X-ray diffraction spectrum measurement is shown for samples (T179-T185) covered by the aforesaid Ti interlayer 15 and TiB$_x$ strengthening layer 16, where deposition of the TiB$_x$ layer were performed under different deposition conditions. The peaks P1 refer to a TiB$_2$ (001) orientation in the TiB$_x$ layer. Different deposition conditions result in different (001) peaks P1. That is, the deposition conditions result in different structure of the hexagonal nanocrystalline arrangement of the TiB$_x$ layer. As depicted on FIG. 3, the peaks can vary in terms of intensity and broadening; however, the angular position of the peaks remains the same. The bias voltage, applied on the razor blade edge substrate 10, for achieving the aforesaid coatings is between 40V and 500V. The density of the TiB$_x$ nanocrystalline strengthening layer 16 can not be measured on a razor blade edge. The same coating deposited on a flat sample has a density which is between 3.9 g/cm$^3$ and 4.4 g/cm$^3$. An increased density is related to an increased strength of the layer.

As an example of thicknesses of the Ti interlayer 15 and the TiB$_x$ strengthening layer 16, 40 nm of Ti interlayer 15 and 60 nm of TiB$_x$ strengthening layer 16 can be considered. However, other dimensions of the thicknesses can be considered for both of the layers, wherein the overall thickness of Ti interlayer 15 and the TiB$_x$ strengthening layer 16 does not exceed 500 nm and, in some cases, does not exceed 150 nm.

Figure 4:
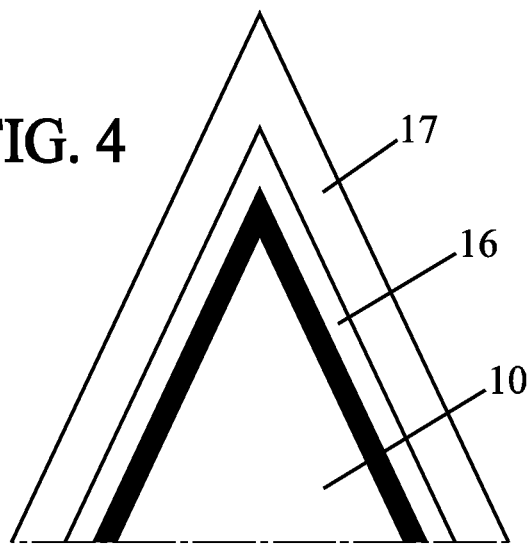
FIG. 4 is a schematic drawing of a coated blade edge profile in sectional view.

The razor blade, more particularly the razor blade edge substrate 10 is covered by a strengthening coating 16 including a strengthening layer 16 made of TiB$_x$. In another embodiment, the strengthening coating 16 might comprise a strengthening layer 16 and a Ti interlayer 15. The strengthening layer 16 disorderly includes areas having different proportions of titanium and boron atoms, and in at least one area, the proportion of boron and titanium is included between y:1 and z:1, wherein y and z are included between 1.3 and 1.99, and y is lower than z, and/or wherein, in at least one area, the proportion of boron and titanium is included between u:1 and v:1, wherein u and v are included between 2.01 and 2.3 and u is lower than v. The average proportion of boron and titanium atoms in the strengthening layer 16 is between 1.3:1 and 2.3:1. Overall titanium-rich coatings would, in average, have x included between 1.3 and 1.99. The razor edges of the razor blades might be coated by a strengthening coating including a sole strengthening layer 16, as described above. This coating layer configuration is depicted on FIG. 4, where the blade edge substrate 10 is covered by a strengthening layer 16. The strengthening layer 16 is covered by a polymer coating (PTFE) 17. The razor blade substrate including the razor blade edge is made of stainless steel. A suitable stainless steel includes mainly iron, and, in weight 0.62-0.75% of carbon,
12.7-13.7% of chromium,
0.45-0.75% of manganese,
0.20-0.50% of Silicon,
No more than traces of Molybdenum.

Other stainless steels can be used within the present invention.

Figure 5:
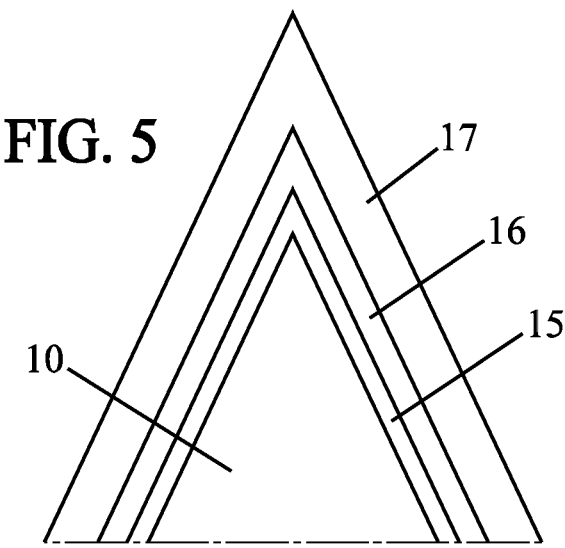
FIG. 5 is a schematic drawing of a coated blade edge profile in sectional view.

The coating layer configuration of the blade edge substrate 10 might include also an interlayer 15 between the razor blade edge substrate 10 and the strengthening layer 16. This coating layer configuration is depicted on FIG. 5, where the blade edge substrate 10 is covered by an interlayer 15 which is covered by a strengthening layer 16. The interlayer 15 may be of titanium. The titanium interlayer 15 may be made of columnar nanocrystals, without adversely affecting the strengthening layer 16. The strengthening layer 16 is covered by a polymer coating (PTFE) 17.

The thickness of the strengthening layer 16, measured normal to the substrate side, is between 20 and 150 nanometres (nm). Alternately, this thickness is between 40 and 250 nanometres (nm). In general, this layer can be between 20 and 400 nm.

Furthermore, the strengthening coating might comprise a metal-containing overcoat layer 20 over the strengthening layer 16. For example, the metal-containing overcoat layer 20 is a layer of Chromium. This coating layer configuration is depicted on FIG. 6, where the blade edge substrate 10 is covered by an interlayer 15 which is covered by a strengthening layer 16. The strengthening layer 16 is covered by a metal-containing overcoat layer 20 which is covered by a polymer coating (PTFE) 17. The metal-containing overcoat layer can further improve the overall hardness of the blade edge coating. And/Or, it can be used to assist adherence of the lubricating layer 17 on the strengthening coating.

This new blade coating can be used with razor blades with conventional geometry. However, it can also be used to coat razor blade substrates with new geometry, while still exhibiting correct shaving performance.

Figure 8:
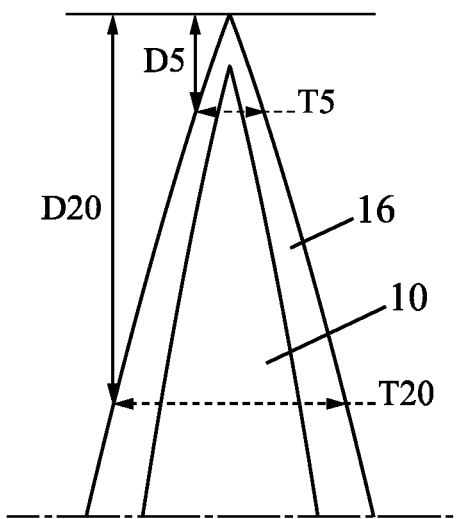
FIG. 8 is a sectional view of a razor blade illustrating geometrical measurements.

A thickness $t_5$ of the blade (considering the substrate and the strengthening coating, excluding the polymer coating), measured between the two coating sides orthogonal to a line bisecting the blade edge portion (see FIG. 8), at a distance of 5 micrometers from the coating tip, can be for example between 1.8 micrometers and 2.5 micrometers, and preferably between 1.9 and 2.4 micrometers, when measured using confocal microscopy.

A thickness $t_{20}$ of the blade (considering the substrate and the strengthening coating, excluding the polymer coating), measured between the two coating sides orthogonal to a line bisecting the blade edge portion (see FIG. 8), at a distance of 20 micrometers from the coating tip, can be for example between 5.1 micrometers and 7.3 micrometers, and preferably between 5.4 and 7.1 micrometers.

Figure 7:
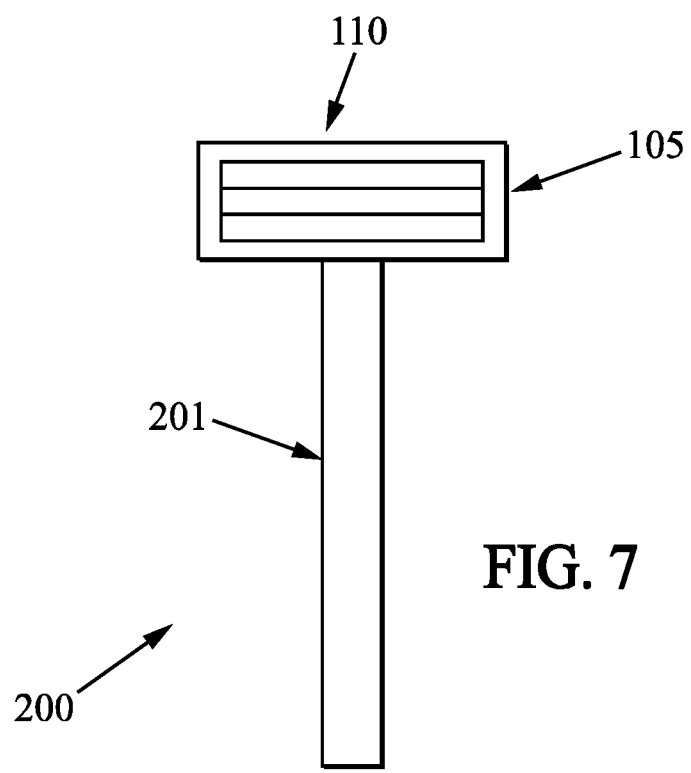
FIG. 7 is a schematic view of a shaver.

Furthermore, FIG. 7 illustrates two above described razor blades which are mounted into a razor cartridge 105 to form a razor head 110 that is connected to a razor handle 201 to form a shaver 200 for shaving purposes.

The razor blades with the above described strengthening coatings were also tested. A first test includes hardness measurements performed on coatings deposited on flat samples. Deposition of the $TiB_x$ coating, as defined above, on flat samples, revealed that the hardness of the nanocrystalline strengthening layer 16 reached up to 15.8 GPa, which is much more than the hardness obtained for standard current coatings deposited on the same flat samples. Greater hardness of the coating on razor blades can therefore be expected.

The aforementioned coated razor blades were also compared with standard production blades. The blades coated by Titanium, $TiB_x$, Chromium and PTFE layers, as described above, were compared to standard production blades coated by Chromium, CrC and PTFE layers. The substrate's material and profile, the total inorganic coating thickness and the thickness of the PTFE coating was the same for the blades according to the present invention and for the standard production blades. The specific test involves repeating cutting action of the blade on a moving felt, using a load cell for measuring the load on the blade for a series of 10 cuts. The test resulted in load ranges for the last ($10^{th}$) cut that were at least 39% lower than the load of blades from standard production. This result (see Table 1) shows that the blades with the above described $TiB_x$-containing coating preserve their cutting ability, shape and integrity, in a more effective manner during cutting action.

The damage imposed on the blade edge after 10 cuts during the above-described test was also evaluated with an optical microscope. The damage on the blade edge tip was quantified in terms of area of missing material (i.e. material that has been broken and removed from the edge) and area of intense deformation. $TiB_x$ coated blades resulted in a 90% decrease of the missing and/or intensely deformed material area as compared with blades from standard production. This result (see Table 1) shows the increased durability of the blades with the aforesaid $TiB_x$ coating. The increased durability could allow employing thinner blade edge profiles in razor blade products that would in turn be beneficial in the shaving performance of the product in terms of fluidity and overall evaluation.

TABLE 1

Cutting force results and edge damages for $TiB_x$ and conventional coatings

| Razor blade sample | Force at $10_{th}$ cut (kg) | Area of damages ($\mu m^2$) |
| --- | --- | --- |
| Conventional coating | 3.19 | 51822 |
| $TiB_x$ | 1.95 | 6169 |

Above, an embodiment was presented wherein an overall Ti-rich $TiB_x$ layer can be deposited by adjusting the current ratio of the Ti and $TiB_2$ targets during simultaneous operation of those targets. However, there appears to be other ways to obtain the above-described coating based on suitable choices of operating parameters such as current applied on the targets, blade bias voltage, displacement speed of the blades, chamber inner pressure. In particular, due to different deposition yields of Titanium and Boron from the $TiB_2$ targets, boron-rich areas can be obtained. The average proportion of boron and titanium atoms in the strengthening layer 16 is between 2.01:1 and 2.3:1.

Outside from the scope of the original claim 1, these parameters could be adjusted in order to deposit a $TiB_2$ coating. Although the $TiB_2$ coating would not exhibit the composition of the original claim 1 which makes the coating particularly suitable as a razor blade coating such as exemplified above, it is contemplated that some $TiB_2$ coatings could be achieved that could also show some benefits as a razor blade strengthening coating. Some preliminary tests suggest that a razor blade with a specific profile as disclosed above could benefit from titanium- and boron-containing coatings for increased shaving performance. Some preliminary tests also suggest that a razor blade with a dense titanium- and boron-containing coating as discussed above could provide increased shaving performance.

Thickness data for the layers of the strengthening coating can be obtained by Auger Electron Spectroscopy Depth Profiling (AESDP). The measurement can be performed on the razor blade itself (for example after getting rid of the polymer coating, or before applying the polymer coating).

Auger Electron Spectroscopy Depth Profiling is accomplished by exciting a blade edge surface with a finely focused electron beam, which causes Auger electrons to be emitted from the surface of the blade edge. These electrons relate to the material located approximately up to 5 nm deep from the surface. They are detected by use of an electron spectrometer consisting of an energy analyzer and an electron detector system. The measured energies of the Auger electrons can be correlated to corresponding elements of the analyzed material.

To record elemental depth profiles of selected elements, the sample surface is removed, for example sputtered away by bombardment with Ar+ ions. The removal rate (in nanometres/minute) of the sputtering process on this kind of coating is known from previous calibration measurements.

The profiling experiment is stopped when the Auger Electron Spectroscopy determines that the main material is the substrate material (most often stainless steel in the field of razor blades). Thus, knowing the overall thickness of the coating, it is possible to determine at which depth each of the measurements was performed.

The analyzed region for the survey spectra and depth profile can be located very close to the tip of the blade (5-10 μm away from the edge tip). Its size is of the order of magnitude 10 μm (for example a square patch of 10 μm×10 μm).

Prior to AES analysis, the blade samples are mounted on a sample holder and introduced into the ultrahigh vacuum chamber of the Auger Electron Spectrometer. Auger survey spectra are measured on the as received surface and after certain sputter times depending on profiling intensities, looking for the elements located in the thin film on the blade edge.

Depth profiling can be carried out by sputtering, for example by applying 3 keV Ar+ ion energy. Accurate depth scale quantification is possible by applying pre-calibrated sputter rates (i.e. material thickness removal as a function of time). These sputter rates are determined on reference standards with the same coatings as the analyzed samples. These samples were prepared by depositing on flat substrates thin films of identical composition, and deposited under the same conditions, as the layers on the blade edge and measuring their thickness by another profiling method in order to calibrate the AES method.

The other profiling method could be for example to place a mask on a sample to be coated and, further to deposition, to remove coating material where the mask was placed, so as to measure the height of the step between the remaining coated material and the substrate where the coating material was removed.

Alternatively, an approximated value for sputter rates can be determined from known sputter rates applied to the coating deposited on the certified reference material BCR-261T (Ta$_2$O$_5$(100 nm)/Ta-sheet).

Hence, according to one aspect, one applies a method for determining a razor blade strengthening coating composition, wherein one repeatedly performs:

One measures the surfacic composition of the coating and,

One removes material from the coating at a given sputter removal rate, until one reaches an underlying layer or the razor blade substrate and using sputter removal rate calibration data for the coating and the total strengthening coating thickness from another measurement method, one attributes the measured surfacic compositions to a depth within the coating. This determination method can be applied for a TiB$_x$ coating, but could be applied to other strengthening coatings as well.

The invention claimed is:

1. A razor blade comprising:
a blade substrate having a substrate edge portion;
the substrate edge portion having a tapering geometry with two sides converging toward a substrate tip; and
a strengthening coating deposited on at least the blade substrate edge portion, covering the two sides of the substrate tip;
the strengthening coating including a nanocrystalline layer made of a mixture of titanium and boron; the nanocrystalline layer having atoms of nanocrystals arranged in a hexagonal lattice configuration.

2. The razor blade according to claim 1, wherein the nanocrystalline layer includes areas of non-columnar titanium diboride.

3. The razor blade according to claim 1, wherein the strengthening coating includes an interlayer between the blade substrate and the strengthening layer.

4. The razor blade according to claim 3, wherein the interlayer includes titanium nanocrystals having columns with diameters of up to 10-12 nm.

5. The razor blade according to claim 1, wherein the average proportion of boron and titanium atoms in the strengthening layer is between about 1.3:1 and about 2.3:1.

6. The razor blade according to claim 1, wherein the strengthening layer is deposited under conditions which, when applied to deposition on a flat witness sample, provide a coating having a density of between about 3.9 grams per cubic centimeter (g/cm3) and about 4.4 grams per cubic centimeter (g/cm3).

7. The razor blade according to claim 1, wherein a combined thickness of the blade substrate and the strengthening coating, measured between the two coating sides orthogonal to a line bisecting the blade edge portion, at a distance of about 5 micrometers from the coating trip, is between about 1.8 and about 2.5 micrometers.

8. The razor blade according the claim 1, wherein a combined thickness of the blade substrate and the strengthening coating, measured between the two coating sides orthogonal to a line bisecting the blade edge portion, at a distance of about 20 micrometers from the coating tip, is between about 5.1 and about 7.3 micrometers.

9. The razor blade according to claim 1, wherein the razor blade substrate is made of stainless steel.

10. The razor blade according to claim 3, wherein the strengthening coating includes an overcoat layer over the strengthening layer.

11. The razor blade according to claim 10, wherein the overcoat layer contains metal.

12. The razor blade according to claim 3, wherein a combined thickness of the strengthening layer and the interlayer does not exceed about 150 nanometers (nm).

13. The razor blade according to claim 3, wherein a combined thickness of the strengthening layer and the interlayer does not exceed about 500 nanometers (nm).

14. The razor blade according to claim 1, further comprising a polymer coating over the strengthening coating.

15. The razor blade according to claim 3, further comprising a polymer coating over the strengthening coating.

16. The razor blade according to claim 10, further comprising a polymer coating over the overcoat layer.

17. The razor blade according to claim 1, wherein the strengthening layer disorderly includes areas having different proportions of titanium and boron atoms.

18. The razor blade according to claim 17, wherein at least one area the proportion of boron and titanium between y:1 and z:1, wherein y and z are between about 1.3 and about 1.99, and y is lower than z.

19. The razor blade according to claim 17, wherein at least one area the proportion of boron and titanium is between u:1 and v:1, wherein u and v are between about 2.01 and about 2.3 and u is lower than v.

20. The razor blade according to claim 1, wherein the blade substrate is angular or curved.

* * * * *